| (12) | United States Patent<br>Zhang et al. | (10) Patent No.: US 12,414,323 B1<br>(45) Date of Patent: Sep. 9, 2025 |
|---|---|---|

(54) LDMOS DEVICE AND FABRICATION METHOD THEREOF

(71) Applicant: CanSemi Technology Inc., Guangdong (CN)

(72) Inventors: Rilin Zhang, Guangdong (CN); Wenhu Liu, Guangdong (CN); Yonghua Zhang, Guangdong (CN)

(73) Assignee: CanSemi Technology Inc., Guangzhou (CN)

( * ) Notice: Subject to any disclaimer, the term of this patent is extended or adjusted under 35 U.S.C. 154(b) by 0 days.

(21) Appl. No.: 19/190,673

(22) Filed: Apr. 27, 2025

Related U.S. Application Data (63) Continuation of application No. PCT/CN2024/134913, filed on Nov. 27, 2024.

(30) Foreign Application Priority Data

Mar. 8, 2024 (CN) .......................... 202410265525.1

(51) Int. Cl.
| *H10D 30/65* | (2025.01) |
| *H10D 30/01* | (2025.01) |
| *H10D 62/10* | (2025.01) |
| *H10D 64/00* | (2025.01) |
| *H10D 64/27* | (2025.01) |
| *H10D 64/66* | (2025.01) |

(52) U.S. Cl.
CPC ....... *H10D 30/655* (2025.01); *H10D 30/0289* (2025.01); *H10D 30/658* (2025.01); *H10D 62/102* (2025.01); *H10D 64/112* (2025.01); *H10D 64/117* (2025.01); *H10D 64/518* (2025.01); *H10D 64/661* (2025.01)

(58) Field of Classification Search
CPC ............. H10D 30/655; H10D 30/0289; H10D 30/658; H10D 62/102; H10D 64/112; H10D 64/117; H10D 64/518; H10D 64/661

See application file for complete search history.

(56) References Cited

U.S. PATENT DOCUMENTS

2024/0162345 A1* 5/2024 Pandey ............. H01L 21/76224

OTHER PUBLICATIONS

CNIPA, Notification to grant patent right for invention in CN202410265525.1, Apr. 17, 2024.

* cited by examiner

*Primary Examiner* — Mohammed R Alam
(74) *Attorney, Agent, or Firm* — Hemisphere Law, PLLC; Zhigang Ma (57) ABSTRACT

The disclosure provides a LDMOS device and a fabrication method. By arranging a first field oxide, a second field oxide, a third field oxide, a gate polysilicon, and a gate oxide layer in the trench and making the surface of the gate polysilicon away from the trench flush with the trench opening, the lateral dimension of the LDMOS device is reduced. Meanwhile, by setting the thickness of the first field oxide and the third field oxide to be greater than that of the second field oxide, setting the height of the first field oxide to be less than or equal to the distance from the bottom of the trench to the channel region, and making the surface of the third field oxide away from the trench flush with the opening of the trench, three independent field plates are formed in the trench. This improves breakdown voltage resistance of the LDMOS device.

7 Claims, 11 Drawing Sheets

LDMOS DEVICE AND FABRICATION METHOD THEREOF

CROSS REFERENCE TO RELATED APPLICATION

This application is a Continuation of PCT Patent Application No. PCT/CN2024/134913 filed on Nov. 27, 2024, which claims priority of China Patent Application No. 2024102655251 filed on Mar. 8, 2024. The contents of the above-identified applications are incorporated herein by reference.

TECHNICAL FIELD

The disclosure relates to semiconductor technologies, and particularly to a Laterally Double-diffused Metal Oxide Semiconductor (LDMOS) device and a fabrication method thereof.

BACKGROUND

Bipolar-CMOS-DMOS (BCD) process is a semiconductor technology that integrates Bipolar Junction Transistors (BJT), Complementary Metal-Oxide-Semiconductor (CMOS), and Double-diffused Metal-Oxide-Semiconductor (DMOS) on a single chip. During the fabrication of LDMOS transistors, field plates are widely adopted to reduce the surface peak electric fields and improve breakdown voltage. These field plates are typically formed by extending the gate polysilicon over the field oxide layer. However, such LDMOS structures have a large lateral dimension, which prevents efficient utilization of chip area.

SUMMARY

In view of the above, the disclosure provides an LDMOS device and a fabrication method thereof to reduce the lateral dimension of the LDMOS device while improving its breakdown voltage.

The disclosure provides an LDMOS device includes a substrate, a first field oxide, a second field oxide, a third field oxide, a gate oxide layer, and a gate polysilicon. The substrate has a channel region and a drift region disposed on one side of the channel region, the drift region having a drain region; a trench disposed between the drain region and the channel region and spaced apart from the drain region, a first direction being from a bottom of the trench towards an opening of the trench, and a second direction being from the channel region towards the drain region; the trench having a first field plate region, a second field plate region, and a third field plate region sequentially connected along the second direction. The first field oxide, the second field oxide, and the third field oxide being sequentially connected and filled in the trench, the first field oxide is located in the first field plate region, the second field oxide is located in the second field plate region, and the third field oxide is located in the third field plate region, wherein a thickness of the third field oxide and a thickness of the first field oxide are both greater than a thickness of the second field oxide; in the second direction, the thickness of the first field oxide decreases, and the first field oxide has a shape of an upward convex arc; the thickness of the first field oxide is less than or equal to a distance from the bottom of the trench to a bottom of the channel region, and a side of the third field oxide away from the trench is flush with a trench opening of the trench. In the first direction, the gate oxide layer is disposed on the first field oxide and located on a side of the trench. The gate polysilicon is filled on the first field oxide and the second field oxide in the trench, a side of the gate polysilicon away from the trench is flush with the trench opening, the gate oxide layer and the third field oxide are disposed on sides of the gate polysilicon.

In some embodiments, the gate oxide layer is in contact with the channel region.

In some embodiments, a side of the gate oxide layer away from the bottom of the trench is flush with the opening of the trench.

In some embodiments, a thickness of the gate oxide layer is 60-500 Å.

In some embodiments, the LDMOS device further includes a dielectric layer disposed on the substrate, the gate polysilicon, and the gate oxide layer.

The disclosure further provides a fabrication method for the LDMOS device, includes steps of: providing a substrate having a drift region; performing patterning on the substrate to form a trench in the drift region, a first direction being from a bottom of the trench towards an opening of the trench, and a second direction being from a channel region towards a drain region; the trench having a first field plate region, a second field plate region, and a third field plate region sequentially connected along the second direction; disposing an oxide material layer on the substrate, the oxide material layer extending into the trench; performing thinning on the oxide material layer located on the second field plate region to form a second field oxide; performing dry etching on the oxide material layer to remove a portion of the oxide material layer located on the first field plate region and the oxide material layer located on the substrate near the first field plate region to form a first field oxide located on the first field plate region; forming a gate oxide layer on the first field oxide in the first direction; disposing a polysilicon layer on the substrate, the gate oxide layer, and the oxide material layer, and performing patterning to form a gate polysilicon and a third field oxide that are flush with the opening of the trench, the second field oxide being located in the second field plate region, the third field oxide being located in the third field plate region, and a side of the third field oxide away from the trench being flush with a trench opening of the trench; and performing ion implantation in the substrate to form a channel region and a drain region, the trench being disposed between the channel region and the drain region and spaced apart from the drain region; wherein a thickness of the first field oxide and a thickness of the third field oxide are both greater than a thickness of the second field oxide; in the second direction, the thickness of the first field oxide decreases gradually, and the first field oxide has a shape of an upward convex arc; and the thickness of the first field oxide is less than or equal to a distance from the bottom of the trench to a bottom of the channel region.

In some embodiments, after performing thinning on the oxide material layer located on the second field plate region to form a second field oxide, and before performing dry etching on the oxide material layer to remove the oxide material layer located on the first field plate region and the oxide material layer located on the substrate near the first field plate region to form a first field oxide located on the first field plate region, the method further includes: performing wet treatment on the oxide material layer.

The disclosure provides the LDMOS device and the fabrication method thereof. The LDMOS device includes the substrate, the first field oxide, a second field oxide, a third field oxide, a gate oxide layer, and a gate polysilicon. The substrate has a channel region and a drift region disposed on one side of the channel region. The drift region is provided with a drain region. A trench is disposed between the drain region and the channel region and spaced apart from the drain region. The trench has sequentially connected first, second, and third field plate regions. The first field oxide, the second field oxide, and the third field oxide are sequentially connected and filled in the trench. The first field oxide is located in the first field plate region, the second field oxide is located in the second field plate region, and the third field oxide is located in the third field plate region. The thickness of the first field oxide and the third field oxide are both greater than that of the second field oxide. The height of the first field oxide is less than or equal to the distance from the bottom of the trench to the channel region. The surface of the third field oxide away from the trench is flush with the opening of the trench. The gate oxide layer is filled in the trench and located on the first field oxide. The gate polysilicon is filled on the first field oxide and the second field oxide in the trench. The surface of the gate polysilicon away from the trench is flush with the opening of the trench. The gate oxide layer and the third field oxide are disposed on the side surface of the gate polysilicon. By arranging the first field oxide, the second field oxide, the third field oxide, the gate polysilicon, and the gate oxide layer in the trench and making the surface of the gate polysilicon away from the trench flush with the opening of the trench, the lateral dimension of the LDMOS device is reduced. Meanwhile, by setting the thickness of the first field oxide and the third field oxide to be greater than that of the second field oxide, setting the height of the first field oxide to be less than or equal to the distance from the bottom of the trench to the channel region, and making the surface of the third field oxide away from the trench flush with the opening of the trench, three independent field plates are formed in the trench, which can respectively adjust the electric fields and current flow paths on the left side, bottom, and right side of the trench. This improves the breakdown voltage of the LDMOS device, i.e., enhances the breakdown voltage resistance of the LDMOS device. Additionally, it enables the current to flow closer to the surface of the gate polysilicon, thereby reducing the specific on-resistance.

BRIEF DESCRIPTION OF THE DRAWINGS

To clearly illustrate the technical solutions in the embodiments of the disclosure, the drawings to be used in the description of the embodiments will be briefly introduced below. It is apparent that the drawings described below are merely some embodiments of the disclosure, and those skilled in the art can obtain other drawings based on these drawings without creative efforts.

COMPONENT IDENTIFIERS

10: LDMOS device; 100: substrate; 110: channel region; 111: source region; 112: body region; 120: drift region; 121: drain region; 130: trench; 131: first field plate region; 132: second field plate region; 133: third field plate region; 200: first field oxide; 201: oxide material layer; 202: photoresist layer; 300: second field oxide; 400: third field oxide; 500: gate oxide layer; 600: gate polysilicon; 700: dielectric layer; 800: first connection part; 900: second connection part; 1000: third connection part.

DETAILED DESCRIPTION OF THE EMBODIMENTS

The technical solutions in the embodiments of the disclosure will be clearly and completely described below with reference to the drawings. It is evident that the embodiments described are only some, not all, of the disclosure's embodiments. Based on the embodiments of the disclosure, all other embodiments obtained by those skilled in the art without creative efforts shall fall within the protection scope of the disclosure. The following embodiments and their technical features can be combined with each other without conflict. The following embodiments and their respective technical features can be combined with one another without any conflict.

The disclosure provides a LDMOS device. The LDMOS device includes a substrate, a first field oxide, a second field oxide, a third field oxide, a gate oxide layer, and a gate polysilicon. The substrate has a channel region and a drift region disposed on one side of the channel region. The drift region is provided with a drain region. A trench is disposed between the drain region and the channel region, and spaced apart from the drain region. The trench has sequentially connected first, second, and third field plate regions. The first field oxide, the second field oxide, and the third field oxide are sequentially connected and filled in the trench. The direction from the bottom of the trench toward the opening of the trench is defined as a first direction. The first field oxide is located in the first field plate region, the second field oxide is located in the second field plate region, and the third field oxide is located in the third field plate region. The thickness of the first field oxide and the third field oxide are both greater than that of the second field oxide. The height of the first field oxide is less than or equal to the distance from the bottom of the trench to the channel region. The surface of the third field oxide away from the trench is flush with the opening of the trench. In the first direction, the gate oxide layer is disposed on the first field oxide and located in the trench. The gate polysilicon is filled on the first field oxide and the second field oxide in the trench. The surface of the gate polysilicon away from the trench is flush with the opening of the trench. The gate oxide layer and the third field oxide are disposed on the side surface of the gate polysilicon.

In the disclosure, by arranging the first field oxide, the second field oxide, the third field oxide, the gate polysilicon, and the gate oxide layer in the trench and making the surface of the gate polysilicon away from a bottom of the trench flush with the opening of the trench, the lateral dimension of the LDMOS device is reduced. Meanwhile, by setting the thickness of the first field oxide and the third field oxide to be greater than that of the second field oxide, setting the height of the first field oxide to be less than or equal to the distance from the bottom of the trench to the channel region, and making the surface of the third field oxide away from the trench flush with the opening of the trench, three independent field plates are formed in the trench, which can respectively adjust the electric fields and current flow paths on the left side, bottom, and right side of the trench. This improves the breakdown voltage of the LDMOS device, i.e., enhances the breakdown voltage resistance of the LDMOS device. Additionally, it enables the current to flow closer to the surface of the gate polysilicon, thereby reducing the specific on-resistance.

Figure 1:
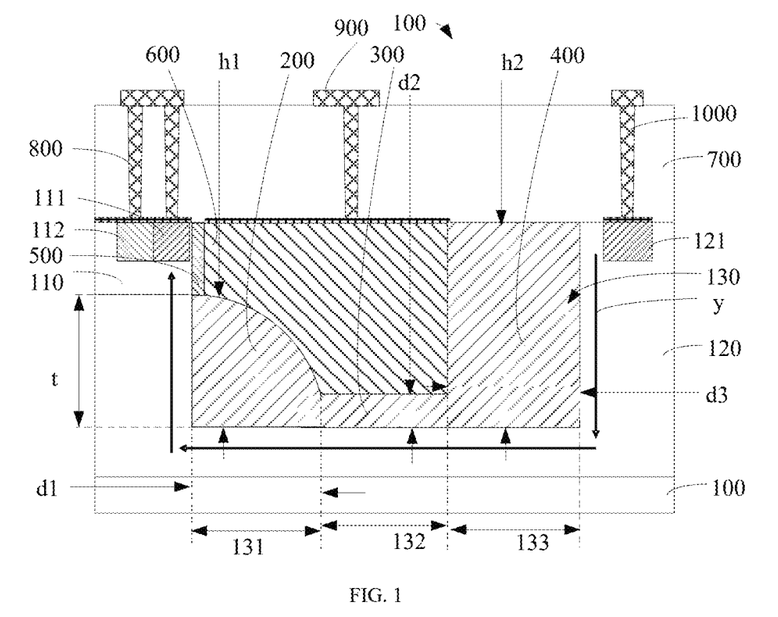
FIG. 1 is a cross-sectional view of a LDMOS device in accordance with an embodiment.

Referring to FIG. 1, a schematic cross-sectional view of the LDMOS device illustrated in accordance with an embodiment. It should be noted that y in FIG. 1 represents the current path. The disclosure provides a LDMOS device 10, which includes a substrate 100, a first field oxide 200, a second field oxide 300, a third field oxide 400, a gate oxide layer 500, a gate polysilicon 600, a dielectric layer 700, a metal silicide, a first connection part 800, a second connection part 900, and a third connection part 1000. The specific descriptions are as follows.

The substrate 100 is a P-type substrate 100, having a channel region 110, and a drift region 120 disposed on one side of the channel region 110. The drift region 120 is provided with a drain region 121. The drain region 121 is spaced apart from the channel region 110. The channel region 110 is provided with a connected source region 111 and a body region 112. The source region 111 is located on a side of the body region 112 adjacent to the drain region 121. A trench 130 is disposed between the drain region 121 and the channel region 110 and spaced apart from the drain region 121. The trench 130 is in contact with the channel region 110. The trench 130 has first, second, and third field plate regions 131, 132, and 133 sequentially connected. The first field plate region 131 is located on the side of the second field plate region 132 adjacent to the source region 111. A direction from the bottom of the trench 130 toward the opening of the trench 130 is defined as a first direction. Optionally, a critical dimension (CD) of the trench 130 ranges from 0.5 to 3 μm, a depth of the trench 130 ranges from 0.5 to 5 μm, and an angle of the trench 130 ranges from 70 to 90 degrees. Optionally, an epitaxial layer can be disposed on the substrate 100, and a thickness of the epitaxial layer ranges from 3 to 12 μm. Specifically, the thickness of the epitaxial layer can be 3 μm, 5 μm, 8 μm, 10 μm, 12 μm, etc.

The first field oxide 200, the second field oxide 300, and the third field oxide 400 are sequentially connected and filled in the trench 130. The first field oxide 200 is located in the first field plate region 131, the second field oxide 300 is located in the second field plate region 132, and the third field oxide 400 is located in the third field plate region 133. A thickness d1 of the first field oxide 200 and a thickness d3 of the third field oxide 400 are both greater than the thickness d2 of the second field oxide 300. A height h1 of the first field oxide 200 is less than or equal to a distance t from the bottom of the trench 130 to the channel region 110. A surface of the third field oxide 400 away from the trench 130 is flush with the opening of the trench 130. h2 is the height of the third field oxide 400, In other words, the height h1 of the first field oxide 200 is less than the height h2 of the third field oxide 400. Further, the field oxides, the gate oxide layer 500, and the gate polysilicon 600 are all filled in the trench 130.

In one embodiment, in the first direction, the thickness d1 of the first field oxide 200 decreases gradually, specifically, the thickness d1 of the first field oxide 200 adjacent to the gate oxide layer 500 is smaller, and the thickness d1 of the first field oxide 200 away from the gate oxide layer 500 is larger. The thickness d1 of the first field oxide 200 away from the gate oxide layer 500 is equal to the thickness d3 of the third field oxide 400, i.e. the thickness d1 of the first field oxide 200 at the bottom of the trench 130 is equal to the thickness d3 of the third field oxide 400.

In one embodiment, the first field oxide 200 has an arcuate shape.

In the first direction, the gate oxide layer 500 is disposed on the first field oxide 200 and located in the trench 130. Optionally, a surface of the gate oxide layer 500 away from the bottom of the trench 130 is flush with the opening of the trench 130. Further, in the direction from the first field oxide 200 toward the third field oxide 400, a thickness of the gate oxide layer 500 ranges from 60 to 500 Å.

The gate polysilicon 600 is filled on the first field oxide 200 and the second field oxide 300 in the trench 130. The surface of the gate polysilicon 600 away from the trench 130 is flush with the opening of the trench 130. The gate oxide layer 500 and the third field oxide 400 are disposed on the side surface of the gate polysilicon 600. Optionally, in the direction from the dielectric layer 700 toward the substrate 100.

The metal silicide is disposed on the channel region 110, the source region 111, the body region 112, the gate polysilicon 600, and the drain region 121. The dielectric layer 700 is disposed on the metal silicide, the gate oxide layer 500, the third field oxide 400, and the drift region 120. The dielectric layer 700 is formed with multiple vias that extend through the dielectric layer 700 and expose the metal silicide. The first connection part 800, the second connection part 900, and the third connection part 1000 are spaced apart and disposed on the dielectric layer 700. The first connection part 800 is filled in the vias located on the source region 111 and the body region 112 to connect the body region 112 and the source region 111. The second connection part 900 is filled in the vias located on the gate polysilicon 600. The third connection part 1000 is filled in the vias located on the drain region 121.

Referring to Table 1, which is a table of performance parameters of Device 1 and Device 2.

TABLE 1

| Item | Vtgm (V) | Idlin (μA) | Ron, sp (mΩ · mm2) | BV (V) | FOM (BV2/Rsp, MW/cm2) | Pitch (μm) |
|---|---|---|---|---|---|---|
| Device 1 | 0.77 | 10.98 | 18.21 | 41.03 | 9.24 | 2.00 |
| Device 2 | 1.10 | 18.90 | 17.13 | 37.60 | 8.25 | 3.21 |

It should be noted that Device 1 in Table 1 is the trench-gate LDMOS device 10 provided in the disclosure, and Device 2 is the existing planar-gate LDMOS device. Vtgm is the threshold voltage under the maximum transconductance method in a linear region. Idlin is the drain current measured when the device operates in the linear region. Ron, sp is the specific on-resistance. BV is the breakdown voltage. Pitch is the lateral dimension of the LDMOS device 10. FOM is the figure of merit of the device.

Figure 2:
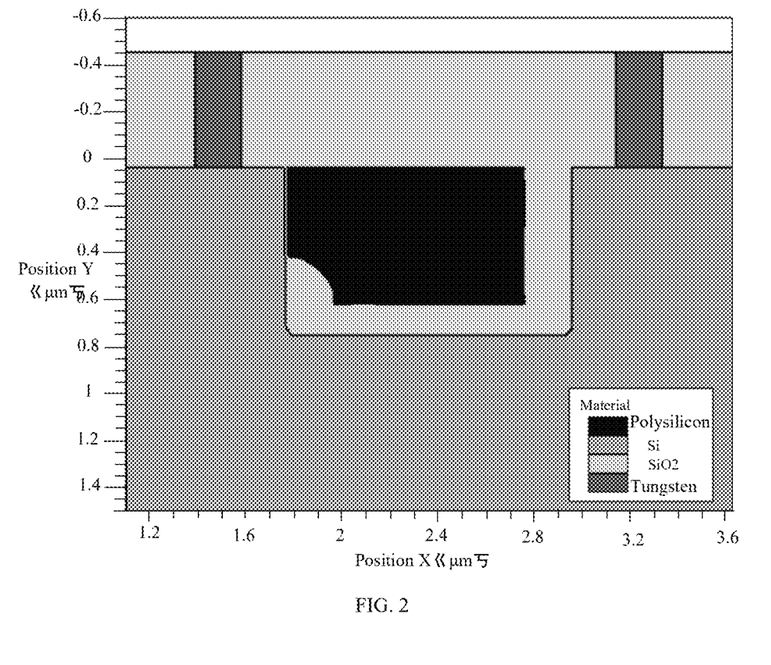
FIG. 2 is a schematic diagram of physical structure of the simulation experiment (TCAD) of the LDMOS device provided in the disclosure.
Figure 3:
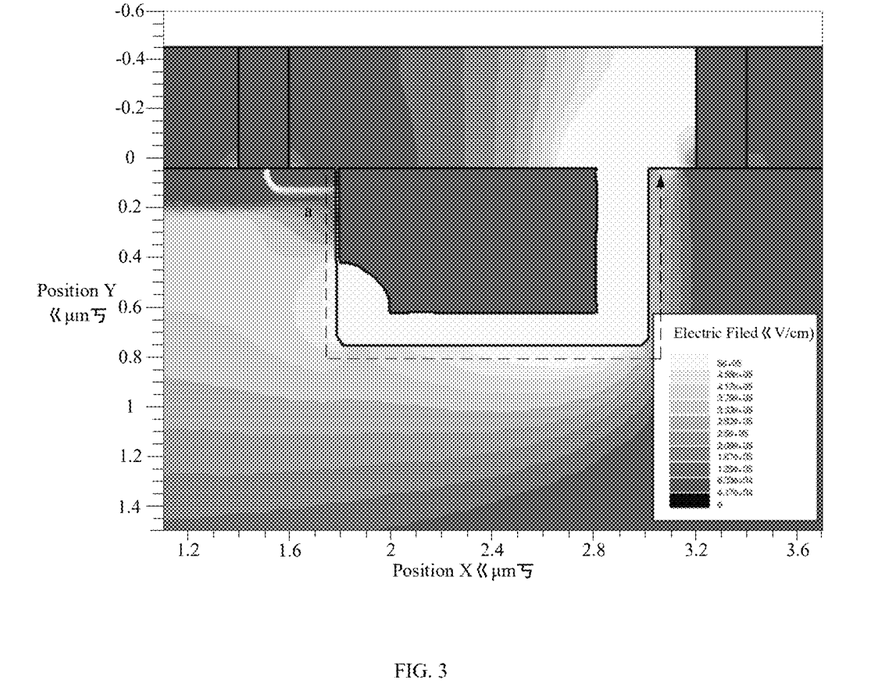
FIG. 3 is a schematic diagram of electric field intensity distribution effect of the LDMOS device in accordance with an embodiment.
Figure 4:
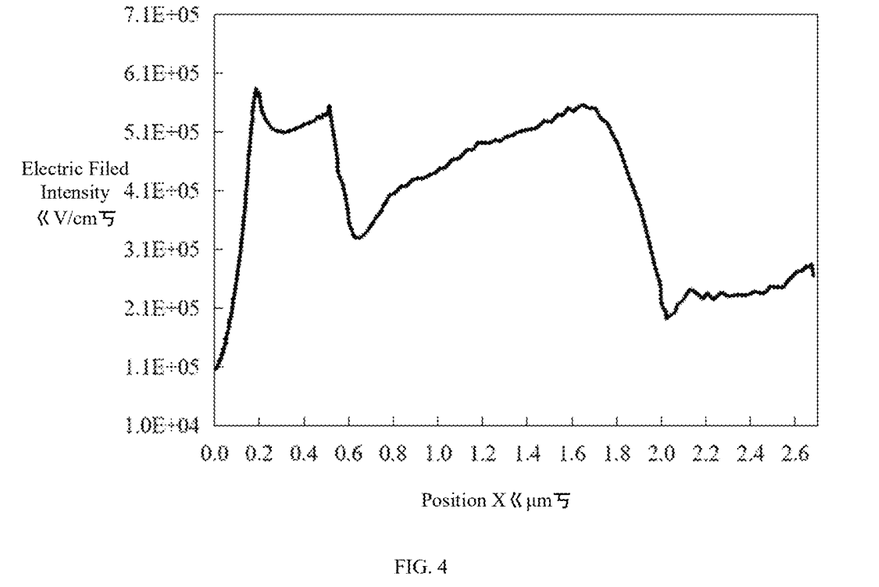
FIG. 4 is a data graph of the electric field intensity along the a tangent line in the LDMOS device of FIG. 3.
Figure 5:
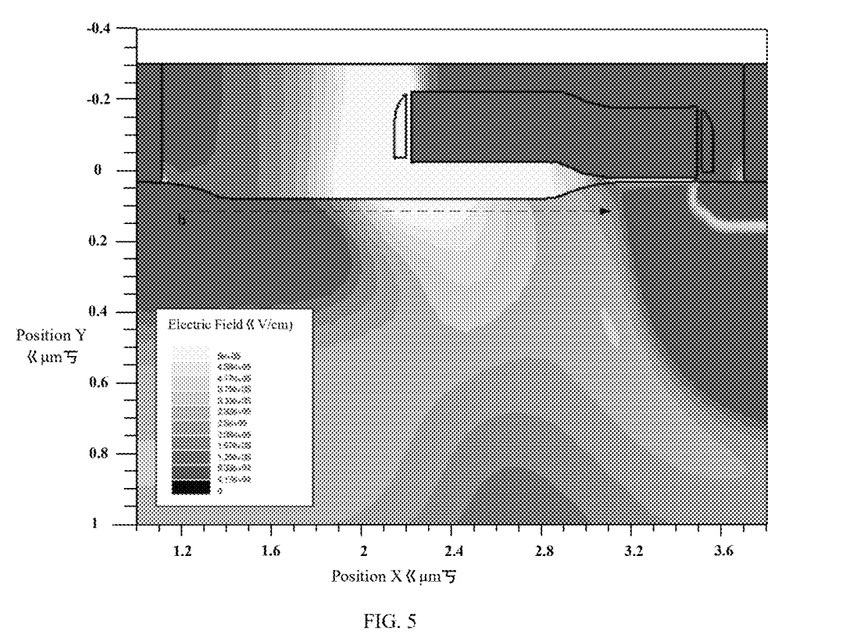
FIG. 5 is a schematic diagram of electric field intensity distribution effect of the existing LDMOS device.
Figure 6:
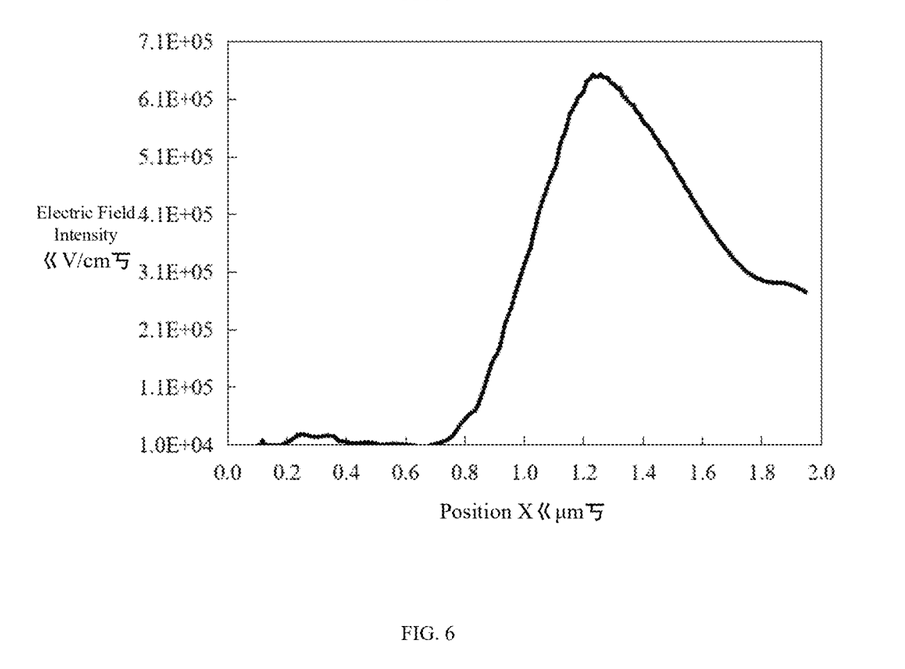
FIG. 6 is a data graph of the electric field intensity along the b tangent line in the LDMOS device of FIG. 5.
Figure 7:
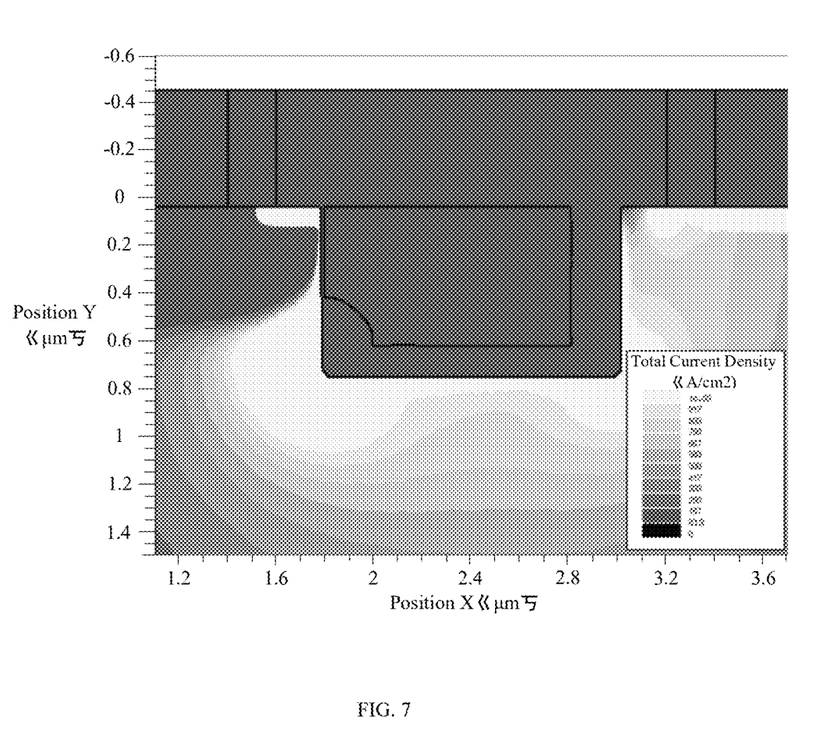
FIG. 7 is a schematic diagram of the current density distribution effect of the LDMOS device provided in the disclosure.
Figure 8:
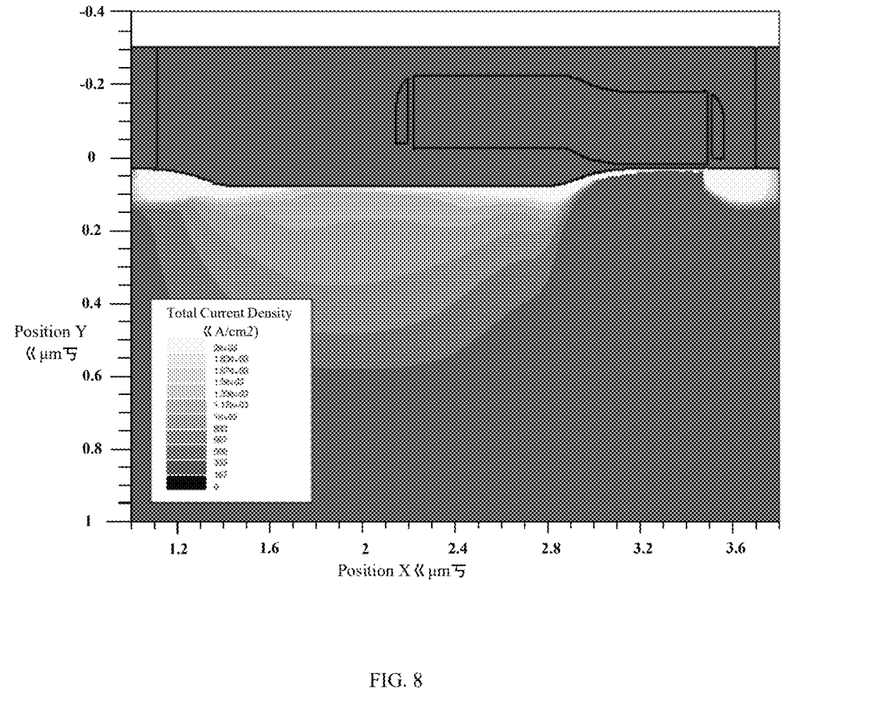
FIG. 8 is a schematic diagram of the current density distribution effect of the existing LDMOS device.

Referring to FIGS. 2-8. FIG. 2 is a schematic diagram of the physical structure of the simulation experiment (TCAD) of the LDMOS device 10 in accordance with the disclosure. FIG. 3 is a schematic diagram of the electric field intensity distribution effect of the LDMOS device 10 in accordance with. FIG. 4 is a data graph of the electric field intensity along the a tangent line in the LDMOS device of FIG. 3. FIG. 5 is a schematic diagram of the electric field intensity distribution effect of the existing LDMOS device. FIG. 6 is a data graph of the electric field intensity along the b tangent line in the LDMOS device of FIG. 5. FIG. 7 is a schematic diagram of the current density distribution effect of the LDMOS device 10 provided in the disclosure. FIG. 8 is a schematic diagram of the current density distribution effect of the existing LDMOS device.

It can be seen therefrom that, in the LDMOS device 10 provided in the disclosure, both the breakdown voltage value BV and the figure of merit FOM are greater than those of the existing LDMOS device, and the lateral dimension Pitch of the LDMOS device 10 provided in the disclosure is also smaller than that of the existing LDMOS device. That is, the LDMOS device 10 provided in the disclosure has a higher breakdown voltage resistance and a smaller lateral dimension, in other words, the integration level of the LDMOS device 10 can be improved while enhancing its breakdown voltage resistance.

It can be seen therefrom that, the trench 130 of the LDMOS device 10 provided in the disclosure is provided with three independent field plates to respectively adjust the electric field and current path, so that the electric field distribution on the left side, bottom, and right side of the trench 130 is more uniform, thereby effectively improving the electric field distribution of the drift region 120 and enabling it to have a higher breakdown voltage. That is, multiple independent field plates are used to respectively adjust the electric field and current density, thereby improving the breakdown voltage resistance of the LDMOS device 10. Moreover, since the current flows closer to the surface of the gate polysilicon 600, the specific on-resistance is reduced.

In the disclosure, by arranging the first field oxide 200, the second field oxide 300, the third field oxide 400, the gate polysilicon 600, and the gate oxide layer 500 in the trench 130 and making the surface of the gate polysilicon 600 away from the trench 130 flush with the opening of the trench 130, the lateral dimension of the LDMOS device 10 is reduced. Meanwhile, by setting the thickness d1 of the first field oxide 200 and the thickness d3 of the third field oxide 400 to be greater than the thickness d2 of the second field oxide 300, setting the height h1 of the first field oxide 200 to be less than or equal to the distance t from the bottom of the trench 130 to the channel region 110, and making the surface of the third field oxide 400 away from the trench 130 flush with the opening of the trench 130, three independent field plates are formed in the trench 130, which can respectively adjust the electric fields and current flow paths on the left side, bottom, and right side of the trench 130. This improves the breakdown voltage of the LDMOS device 10, that is, enhances the breakdown voltage resistance of the LDMOS device 10. Additionally, it enables the current to flow closer to the surface of the gate polysilicon 600, thereby reducing the specific on-resistance.

In the disclosure, in the first direction, the thickness d1 of the first field oxide 200 is set to decrease, so as to further adjust the electric fields and current flow paths on the left side, bottom, and right side of the trench 130, thereby improving the breakdown voltage of the LDMOS device 10, that is, enhancing the breakdown voltage resistance of the LDMOS device 10.

In the disclosure, the first field oxide 200 is set to have an arcuate shape, so as to further adjust the electric fields and current flow paths on the left side, bottom, and right side of the trench 130, thereby improving the breakdown voltage of the LDMOS device 10, i.e., enhancing the breakdown voltage resistance of the LDMOS device 10.

Figure 9:
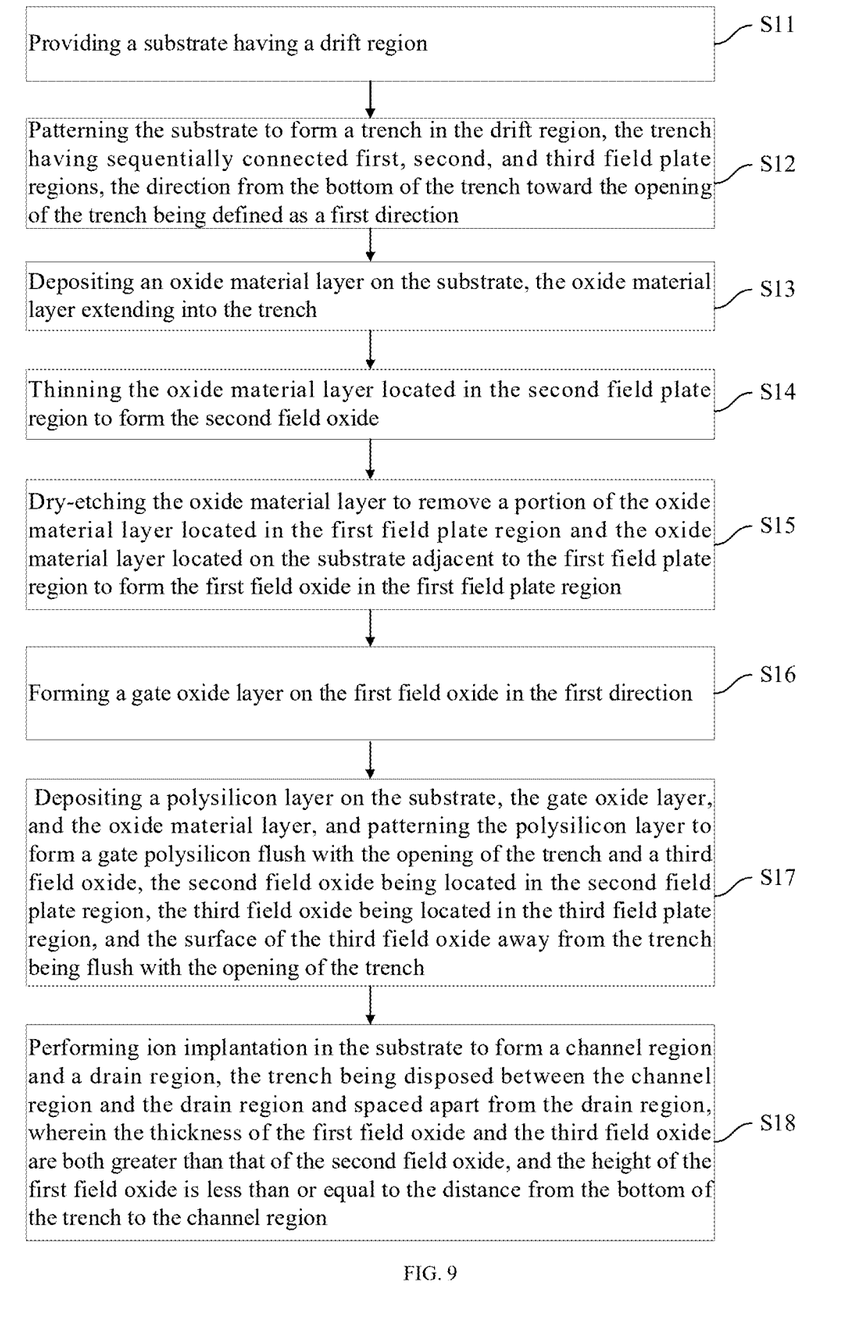
FIG. 9 is a flowchart of the fabrication method of the LDMOS device in accordance with an embodiment.

Referring to FIGS. 9-18. FIG. 9 is a flowchart of the fabrication method of the LDMOS device provided in the disclosure. FIGS. 10-18 are flowcharts of the fabrication method of the LDMOS device provided in the disclosure. The disclosure further provides a fabrication method for the LDMOS device, which is used to fabricate the LDMOS device provided in the disclosure and includes: S11: providing a substrate having a drift region.

Figure 10:
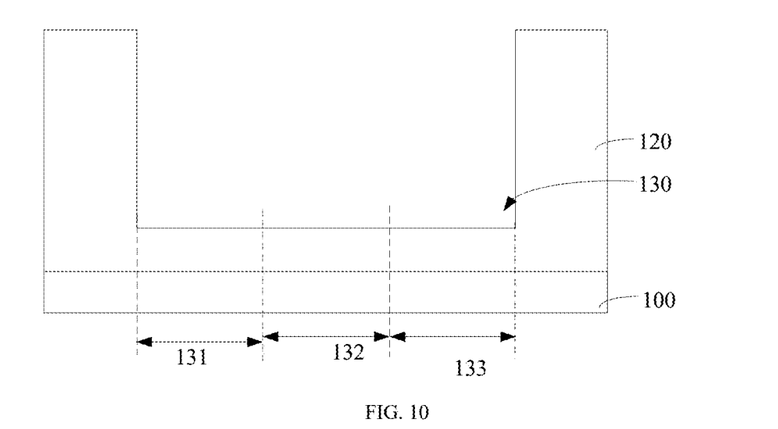
FIGS. 10-18 are flowcharts of the fabrication method of the LDMOS device in accordance with an embodiment.

Specifically, a substrate 100 is provided, and ion implantation is performed on a part of the substrate 100 to form a drift region 120.

Figure 11:
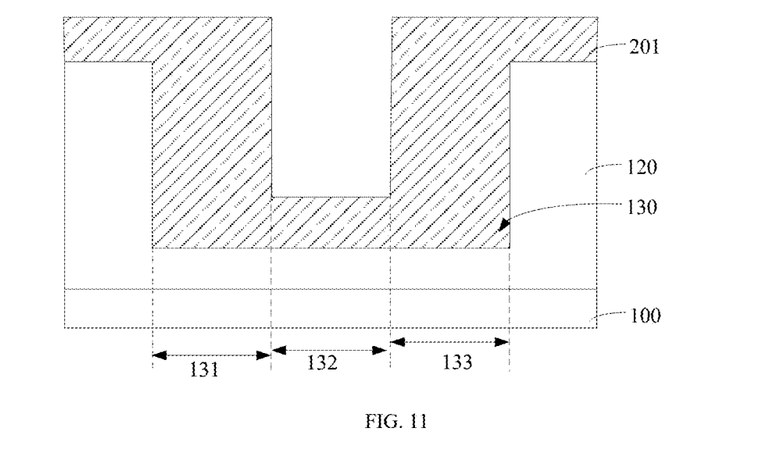

S12: patterning the substrate to form a trench in the drift region, the trench having sequentially connected first, second, and third field plate regions, the direction from the bottom of the trench toward the opening of the trench being defined as a first direction. Specifically, the substrate 100 is etched to form a trench 130.

Figure 12:
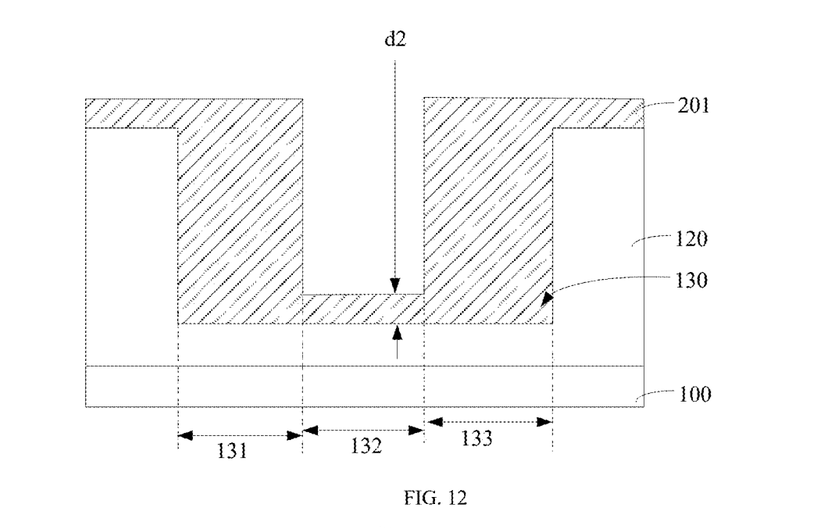

S13: depositing an oxide material layer 201 on the substrate 100, the oxide material layer 201 extending into the trench 130.

Specifically, the oxide material layer 201 is formed on the substrate 100 by CVD deposition or furnace tube growth and extends into the trench 130.

Figure 13:
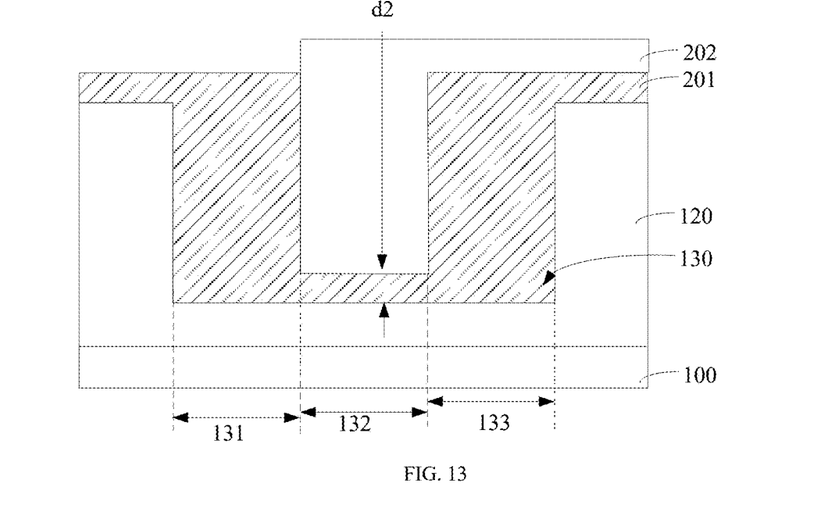

S14: thinning the oxide material layer located in the second field plate region to form the second field oxide.

Specifically, the oxide material layer 201 located in the second field plate region 132 is thinned by etch-back to form the second field oxide 300. The thickness reduced from the original oxide material layer 201 to form the second field oxide 300 is 0.1-0.9 times the original thickness of the oxide material layer 201, so as to further adjust the electric field and current flow path at the bottom of the trench 130.

In one embodiment, after step S14 and before step S15, the method further includes: wet-treating the oxide material layer 201 to eliminate the damage caused by plasma during etch-back in step S14, thereby improving the device performance.

Figure 14:
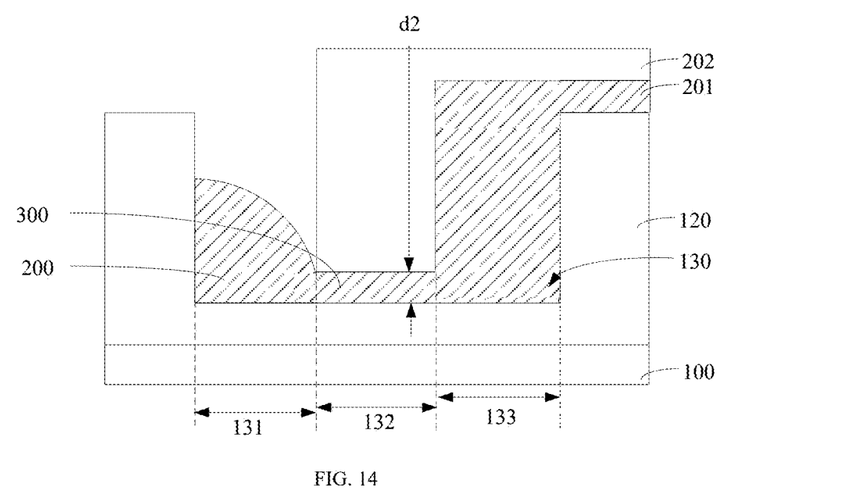

S15: dry-etching the oxide material layer to remove a portion of the oxide material layer located in the first field plate region and the oxide material layer located on the substrate adjacent to the first field plate region to form the first field oxide in the first field plate region.

Specifically, a photoresist layer 202 is formed on the oxide material layer 201, and the photoresist layer 202 exposes the oxide material layer 201 located in the first field plate region 131 and the oxide material layer 201 located on the substrate 100 adjacent to the first field plate region 131. The oxide material layer 201 is dry-etched to remove a portion of the oxide material layer 201 located in the first field plate region 131 and the oxide material layer 201 located on the substrate 100 adjacent to the first field plate region 131, thereby forming the first field oxide 200 in the first field plate region 131. The thickness of the oxide material layer 201 removed from the first field plate region 131 is 0.1-0.8 times the depth of the trench 130, so as to further adjust the electric field and current flow path on the left side of the trench 130. Then, the photoresist layer 202 is removed.

In one embodiment, along the direction from the first field oxide 200 toward the third field oxide 400, the thickness d1 of the first field oxide 200 gradually decreases, i.e., the thickness d1 of the first field oxide 200 adjacent to the gate oxide layer 500 is smaller, and the thickness d1 of the first field oxide 200 away from the gate oxide layer 500 is larger.

Figure 15:
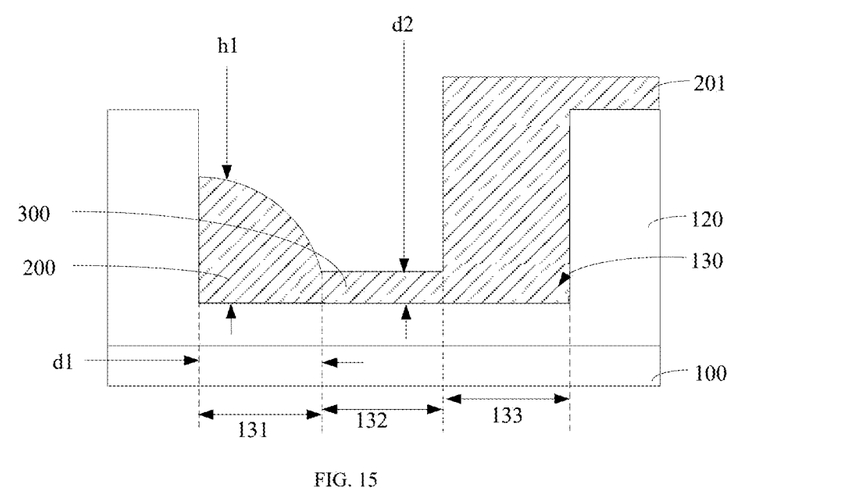

S16: forming a gate oxide layer on the first field oxide in the first direction.

Figure 16:
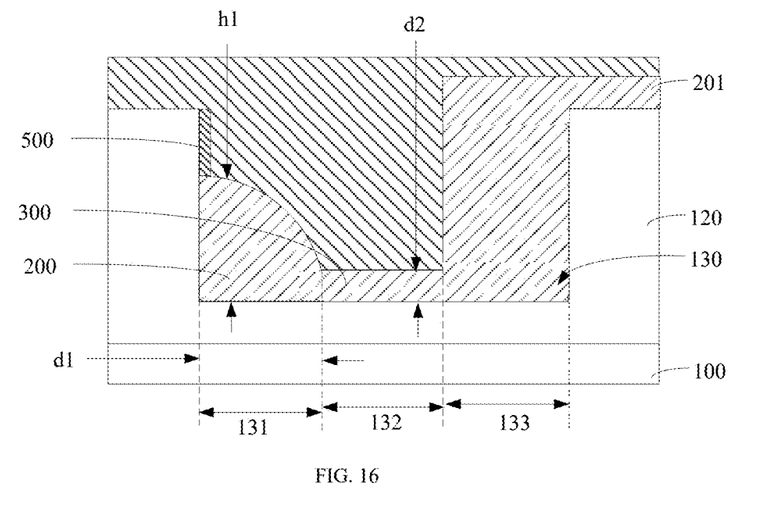

S17: depositing a polysilicon layer on the substrate, the gate oxide layer, and the oxide material layer, and patterning the polysilicon layer to form a gate polysilicon flush with the opening of the trench and a third field oxide, the second field oxide being located in the second field plate region, the third field oxide being located in the third field plate region, and the surface of the third field oxide away from the trench being flush with the opening of the trench.

Figure 17:
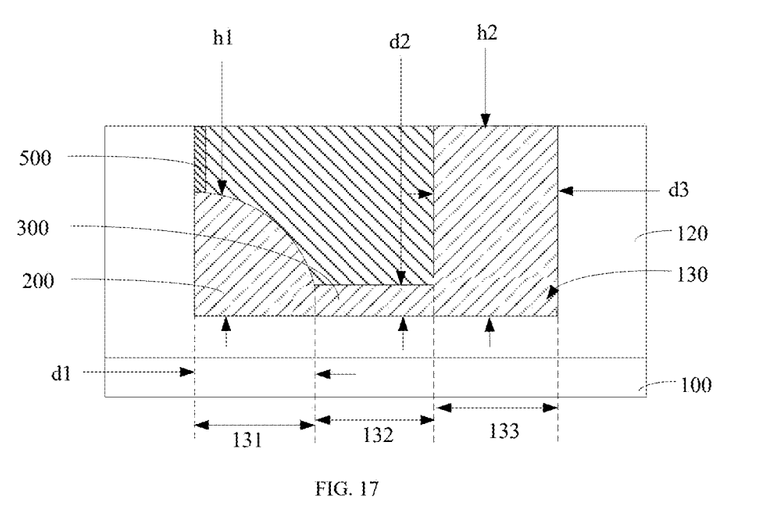

S18: Performing ion implantation in the substrate to form a channel region and a drain region, the trench being disposed between the channel region and the drain region and spaced apart from the drain region, wherein the thickness of the first field oxide and the third field oxide are both greater than that of the second field oxide, and the height of the first field oxide is less than or equal to the distance from the bottom of the trench to the channel region.

Figure 18:
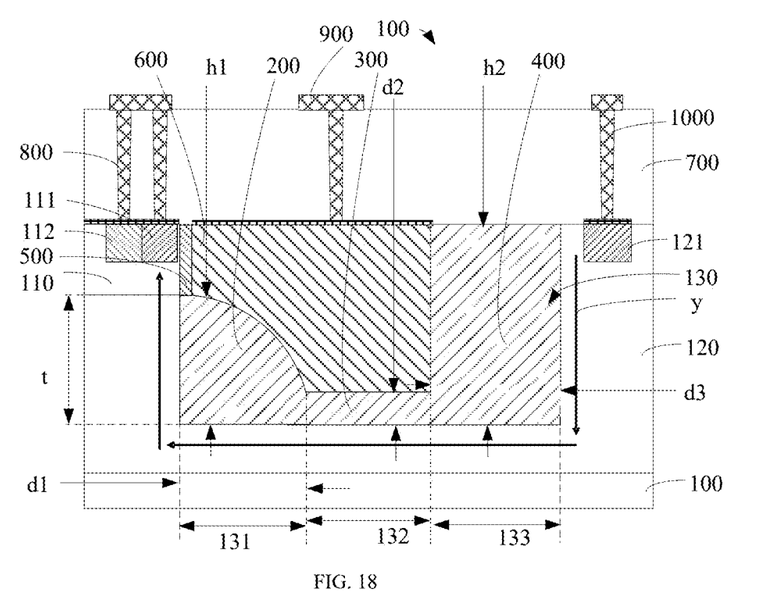

In one embodiment, after step S18, the method further includes: forming a metal silicide, a dielectric layer 700, a first connection part 800, a second connection part 900, and a third connection part 1000 on the substrate 100, the gate polysilicon 600, the third field oxide 400, and the gate oxide layer 500. The metal silicide is disposed on the channel region 110, the source region 111, the body region 112, the gate polysilicon 600, and the drain region 121. The dielectric layer 700 is disposed on the metal silicide, the gate oxide layer 500, the third field oxide 400, and the drift region 120. The dielectric layer 700 has multiple vias penetrating through the dielectric layer 700 and exposing the metal silicide. The first connection part 800, the second connection part 900, and the third connection part 1000 are spaced apart and disposed on the dielectric layer 700. The first connection part 800 is filled in the vias located on the source region 111 and the body region 112 to connect the body region 112 and the source region 111. The second connection part 900 is filled in the vias located on the gate polysilicon 600. The third connection part 1000 is filled in the vias located on the drain region 121.

In the disclosure, the LDMOS device 10 is fabricated by the fabrication method provided in the disclosure. The fabrication method is simple, easy to implement, and can be well compatible with other BCD device processes, while improving the breakdown voltage resistance of the LDMOS device 10 and reducing the specific on-resistance.

The above are merely the embodiments of the disclosure, and the patent scope of the disclosure is not limited thereby. Any equivalent structures or equivalent process transformations made using the contents of the specification and drawings of the disclosure, such as the mutual combination of technical features among various embodiments, or the direct or indirect application in other related technical fields, shall be included in the patent protection scope of the disclosure.

The invention claimed is:

1. ALDMOS device, comprising:
   a substrate, having a channel region and a drift region disposed on one side of the channel region, the drift region having a drain region; a trench disposed between the drain region and the channel region and spaced apart from the drain region, a first direction being from a bottom of the trench towards an opening of the trench, and a second direction being from the channel region towards the drain region; the trench having a first field plate region, a second field plate region, and a third field plate region sequentially connected along the second direction;
   a first field oxide, a second field oxide, and a third field oxide, the first field oxide, the second field oxide, and the third field oxide being sequentially connected and filled in the trench, the first field oxide being located in the first field plate region, the second field oxide being located in the second field plate region, and the third field oxide being located in the third field plate region, wherein a thickness of the third field oxide and a thickness of the first field oxide are both greater than a thickness of the second field oxide; in the second direction, the thickness of the first field oxide decreases, and the first field oxide has a shape of an upward convex arc; the thickness of the first field oxide is less than or equal to a distance from the bottom of the trench to a bottom of the channel region, and a side of the third field oxide away from the trench is flush with a trench opening of the trench;
   a gate oxide layer, in the first direction, the gate oxide layer being disposed on the first field oxide and located on a side of the trench; and
   a gate polysilicon, filled on the first field oxide and the second field oxide in the trench, a side of the gate polysilicon away from the trench being flush with the trench opening, the gate oxide layer and the third field oxide being disposed on sides of the gate polysilicon.

2. The LDMOS device according to claim 1, wherein the gate oxide layer is in contact with the channel region.

3. The LDMOS device according to claim 2, wherein a side of the gate oxide layer away from the bottom of the trench is flush with the opening of the trench.

4. The LDMOS device according to claim 1, wherein a thickness of the gate oxide layer is 60-500 Å.

5. The LDMOS device according to claim 1, further comprising: a dielectric layer disposed on the substrate, the gate polysilicon, and the gate oxide layer.

6. A fabrication method for a LDMOS device, being configured to fabricate the LDMOS device, wherein the LDMOS device comprises: a substrate, having a channel region and a drift region disposed on one side of the channel region, the drift region having a drain region; a trench disposed between the drain region and the channel region and spaced apart from the drain region, a first direction being from a bottom of the trench towards an opening of the trench, and a second direction being from the channel region towards the drain region; the trench having a first field plate region, a second field plate region, and a third field plate region sequentially connected along the second direction; a first field oxide, a second field oxide, and a third field oxide, the first field oxide, the second field oxide, and the third field oxide being sequentially connected and filled in the trench, the first field oxide being located in the first field plate region, the second field oxide being located in the second field plate region, and the third field oxide being located in the third field plate region, wherein a thickness of the third field oxide and a thickness of the first field oxide are both greater than a thickness of the second field oxide; in the second direction, the thickness of the first field oxide decreases, and the first field oxide has a shape of an upward convex arc; the thickness of the first field oxide is less than or equal to a distance from the bottom of the trench to a bottom of the channel region, and a side of the third field oxide away from the trench is flush with a trench opening of the trench; a gate oxide layer, in the first direction, the gate oxide layer being disposed on the first field oxide and located on a side of the trench; and a gate polysilicon, filled on the first field oxide and the second field oxide in the trench, a side of the gate polysilicon away from the trench being flush with the trench opening, the gate oxide layer and the third field oxide being disposed on sides of the gate polysilicon; wherein fabrication method for a LDMOS device comprises: providing a substrate having a drift region; performing patterning on the substrate to form a trench in the drift region, a first direction being from a bottom of the trench towards an opening of the trench, and a second direction being from a channel region towards a drain region; the trench having a first field plate region, a second field plate region, and a third field plate region sequentially connected along the second direction; disposing an oxide material layer on the substrate, the oxide material layer extending into the trench; performing thinning on the oxide material layer located on the second field plate region to form a second field oxide; performing dry etching on the oxide material layer to remove a portion of the oxide material layer located on the first field plate region and the oxide material layer located on the substrate near the first field plate region to form a first field oxide located on the first field plate region; forming a gate oxide layer on the first field oxide in the first direction; disposing a polysilicon layer on the substrate, the gate oxide layer, and the oxide material layer, and performing patterning to form a gate polysilicon and a third field oxide that are flush with the opening of the trench, the second field oxide being located in the second field plate region, the third field oxide being located in the third field plate region, and a side of the third field oxide away from the trench being flush with a trench opening of the trench; and performing ion implantation in the substrate to form a channel region and a drain region, the trench being disposed between the channel region and the drain region and spaced apart from the drain region; wherein a thickness of the first field oxide and a thickness of the third field oxide are both greater than a thickness of the second field oxide; in the second direction, the thickness of the first field oxide decreases gradually, and the first field oxide has a shape of an upward convex arc; and the thickness of the first field oxide is less than or equal to a distance from the bottom of the trench to a bottom of the channel region.

7. The method for fabricating the LDMOS device according to claim 6, wherein after performing thinning on the oxide material layer located on the second field plate region to form a second field oxide, and before performing dry etching on the oxide material layer to remove the oxide material layer located on the first field plate region and the oxide material layer located on the substrate near the first field plate region to form a first field oxide located on the first field plate region, the method further comprises:

performing wet treatment on the oxide material layer.

\* \* \* \* \*